United States Patent
Noguchi et al.

(10) Patent No.: US 7,070,650 B2
(45) Date of Patent: Jul. 4, 2006

(54) DIAMOND FILM AND METHOD FOR PRODUCING THE SAME

(75) Inventors: Hitoshi Noguchi, Gunma (JP); Yoshihiro Kubota, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 142 days.

(21) Appl. No.: 10/421,562

(22) Filed: Apr. 23, 2003

(65) Prior Publication Data

US 2003/0200914 A1    Oct. 30, 2003

(30) Foreign Application Priority Data

Apr. 25, 2002 (JP) ............................. 2002-123920

(51) Int. Cl.
    *C30B 23/00* (2006.01)

(52) U.S. Cl. .................. 117/89; 117/84; 427/249.8
(58) Field of Classification Search .............. 117/89; 427/249.8
    See application file for complete search history.

(56) References Cited

U.S. PATENT DOCUMENTS

| | | | |
|---|---|---|---|
| 5,635,258 A | 6/1997 | Chen et al. | |
| 5,981,057 A * | 11/1999 | Collins | 428/334 |
| 6,533,916 B1 * | 3/2003 | Puetter et al. | 205/188 |
| 6,727,171 B1 * | 4/2004 | Takeuchi et al. | 438/624 |

FOREIGN PATENT DOCUMENTS

JP    06-029193    2/1994

OTHER PUBLICATIONS

Meilunas et al, Proc. Int. Conf. Electron. Mater., 2nd (1990), pp. 609-614, abstract.*
STN Search Report.*
Marumoto, et al., "Fabrication of Diamond Membranes for X-Ray Masks by Hot-Filament Method" Jpn. J. Appl. Phys. vol. 31 (1992) pp. 4205-4209, Part 1, No. 12B, Dec. 1992.
Karabutov, et al., "Surface Engineering of Diamond Tips for Improved Field Electron Emission", Diamond and Related Materials 10 (2001) 2178-2138.
Maeda, et al., "Growth Behavior of Boron-Doped Diamond in Microwave Plasma-Assisted Chemical Vapor Deposition Using Trimethylboron as the Dopant Source", Diamond and Related Materials 7 (1998) 88-95.

* cited by examiner

*Primary Examiner*—Felisa Hiteshew
(74) *Attorney, Agent, or Firm*—Hogan & Hartson LLP

(57) ABSTRACT

There is disclosed a method for producing a diamond film on a base material by a vapor phase reaction at least with introducing a raw material gas, wherein $B(OCH_3)_3$ gas is added to the raw material gas as a source of boron to be doped, and a diamond film is deposited on the base material by a vapor phase reaction utilizing the mixed raw material gas. There can be provided a method enabling easy and uniform production of a diamond film showing a low electric resistivity value with good reproducibility and few problems concerning handling such as serious bad influence on human bodies and explosiveness during the doping process.

15 Claims, 1 Drawing Sheet

DIAMOND FILM AND METHOD FOR PRODUCING THE SAME

BACKGROUND OF THE INVENTION

1. Field of the Invention

The present invention relates to a diamond film and a method for producing the same.

2. Related Art

In recent years, diamond films formed on base materials by utilizing unique properties of diamond have been widely investigated. For example, they are investigated as masking members for light exposure in lithography techniques used in the semiconductor device production, substrates for surface acoustic wave (SAW) devices, grinding and polishing tools and so forth.

In recent years, use of diamond films as a masking membrane in the X-ray lithography and electron beam lithography, which enables formation of extremely fine patterns of 100 nm or less, utilizing their properties of high Young's modulus, etching resistance, high-energy ray irradiation resistance and so forth attracts attentions.

As the methods for producing a diamond film, there are known methods of depositing it on a base material by a vapor phase reaction using DC arc discharge, DC glow discharge, combustion flame, radiofrequency wave (R.F.), microwave, hot filament and so forth. Among these production methods, the microwave CVD method and the hot filament CVD method are generally used, since they enable formation of films having a large size and good crystallinity.

Meanwhile, a raw material gas used in the aforementioned methods of depositing on a base material by a vapor phase reaction is generally a mixed gas obtained by diluting a carbon-containing gas such as methane, ethylene, acetylene and carbon monoxide with hydrogen gas. Electric resistivity of a diamond film obtained by performing a vapor phase reaction using such a hydrogen-diluted carbon-containing gas as a raw material gas is in the range of $10^9$ to $10^{15}$ Ω·cm.

Further, when a diamond film showing an electric resistivity value in such a range is used, for example, as a mask for lithography, especially a mask for X-ray or electron beam lithography, a defect test of the mask must be performed by irradiation with an electron beam. But the resistivity is too high for the test, thus a charge up phenomenon is likely to occur due to accumulation of charged particles, and therefore such a defect test cannot be carried out quickly and precisely in many cases.

Moreover, when it is actually used as a mask for electron beam lithography, a high resistivity causes a problem in image transfer due to the charge up.

Therefore, in order to avoid such a charge up phenomenon, it has been proposed that a dopant gas such as diborane ($B_2H_6$) or phosphine ($PH_3$) is mixed with the aforementioned hydrogen-diluted carbon-containing gas during the production of a diamond film to perform a vapor phase reaction and thereby reduce the electric resistivity value of the diamond film.

Specifically, it is reported that, if $B_2H_6$ as a source of boron to be doped and hydrogen-diluted methane gas as a raw material gas are mixed, and then such a mixed raw material gas is introduced into a chamber to perform a vapor phase reaction and thereby produce a diamond film of P-type, the electric resistivity value of the diamond film can be decreased to $10^{-2}$ Ω·cm (K. Marumoto, J. Appl. Phys., 31 (1992) 4205–4209).

However, if $B_2H_6$ is used as the source of boron to be doped as described above, influence on human bodies is feared, since the permissible concentration thereof is 0.1 ppm. Further, when $PH_3$ is used as the source of phosphorus to be doped, influence on human bodies is similarly feared, since the permissible concentration thereof is 0.3 ppm. That is, leakages even in a small amount are not accepted in doping using these gases. Furthermore, since they not only influence on human bodies but also show explosiveness, and hence they have also a problem concerning handling. Therefore, in order to use these gases, special apparatuses for safety must be used for the apparatuses themselves, piping and so forth, and thus increase of cost is unavoidable.

With the purpose of obviating these problems, there has also been proposed a method of adding boron by vaporizing a solution dissolving $B_2O_3$ in methanol, ethanol, acetone or the like and mixing it with a hydrogen diluted raw material gas for use as a mixed raw material gas. However, this technique has a problem that it is difficult to produce a uniform solution or control temperature of the solution, and thus it is difficult to obtain a uniform diamond film with good reproducibility.

SUMMARY OF THE INVENTION

The present invention was accomplished in view of such problems, and its major object is to provide a method enabling easy and uniform production of a diamond film showing a low electric resistivity value with good reproducibility and few problems concerning handling such as serious bad influence on human bodies and explosiveness during the doping process, at a low cost.

The present invention was accomplished in order to achieve the aforementioned object and provides a method for producing a diamond film on a base material by a vapor phase reaction at least with introducing a raw material gas, wherein $B(OCH_3)_3$ gas is added to the raw material gas as a source of boron to be doped, and a diamond film is deposited on the base material by a vapor phase reaction utilizing the mixed raw material gas.

If $B(OCH_3)_3$ gas is used as a source of boron to be doped in a method of producing a diamond film on a base material by a vapor phase reaction with introducing raw material as described above, boron can be easily and uniformly doped, and the electric resistivity value of the obtained diamond film can be reduced. That is, $B(OCH_3)_3$ gas shows little danger concerning handling such as bad influence on human bodies and explosiveness. Moreover, it enables easy and uniform doping of boron in a diamond film with good reproducibility. Therefore, when this diamond film is used, for example, as a mask for lithography, the charge up phenomenon in the defect test utilizing an electron beam can be avoided, and special apparatuses are not required, either. Therefore, the film can be produced at a low cost.

In the above method, the $B(OCH_3)_3$ gas is preferably added to the raw material gas to be introduced at a volume concentration of more than 0 vol. % but 8 vol. % or less with respect to the total mixed raw material gas.

If the volume concentration of the $B(OCH_3)_3$ gas with respect to the total mixed raw material gas is more than 0 vol. % but 8 vol. % or less, a desired electric resistivity value can be obtained while maintaining high crystallinity.

In the above method, the doping of boron is preferably controlled so that the electric resistivity of the diamond film should become $10^7$ Ω·cm or less at 20° C.

If the doping of boron is controlled so that the electric resistivity of the diamond film should become $10^7$ Ω·cm or less at 20° C. as described above, when this diamond film is used for a mask for lithography, especially a mask for X-ray or electron beam lithography, the charge up phenomenon can be surely avoided in a defect test of the mask utilizing an electron beam. Thus, such a defect test can be quickly and precisely performed. Therefore, it becomes easy to produce a diamond mask of high quality for lithography by utilizing the diamond film.

Moreover, since the charge up phenomenon can be avoided also when the mask is actually used as a mask for the electron beam lithography, it enables highly precise and highly efficient image transfer.

In the above method, when the diamond film is produced on the base material, only a part of the film can be formed with adding $B(OCH_3)_3$ gas to the raw material gas, and the other part of the film can be formed without adding $B(OCH_3)_3$ gas to the raw material gas. Moreover, in this case, the part of the film formed with adding $B(OCH_3)_3$ gas to the raw material gas preferably has a thickness of 0.5 μm or less.

If only a part of the film is formed with adding $B(OCH_3)_3$ gas to the raw material gas, and the other part of the film is formed without adding $B(OCH_3)_3$ gas to the raw material gas as described above, the amount of $B(OCH_3)_3$ used can be reduced. Therefore, desired characteristics can be obtained while minimizing the degradation of the crystallinity, and the cost can also be reduced.

Furthermore, the present invention provides a diamond film uniformly doped with boron produced by the aforementioned production method. This diamond film has a low electric resistivity, and thus it can be used as a mask substrate that is unlikely to cause the charge up phenomenon during the defect test or use thereof.

The present invention further provides an apparatus for producing a diamond film on a base material by a vapor phase reaction with introducing a raw material gas, which comprises, at least, a tank for supplying raw material gas, an apparatus for supplying $B(OCH_3)_3$ gas as a source of boron to be doped, a chamber for depositing the diamond film on the base material by a vapor phase reaction and an energy source for the vapor phase reaction.

If an apparatus for producing a diamond film is constituted as described above, a mixed raw material gas obtained by adding $B(OCH_3)_3$ gas as a source of boron to be doped to a raw material gas can be introduced to a chamber through an inlet pipe, and a diamond film doped with boron can be easily produced by a vapor phase reaction in the chamber at a low cost without providing conventionally used special apparatuses for safety.

As explained above, according to the present invention, problems concerning danger of handling such as serious bad influence on human bodies and explosiveness during the doping process are reduced by using $B(OCH_3)_3$ instead of $B_2H_6$ or $PH_3$ which is generally used in conventional techniques, and thus special apparatuses as a safety measure become unnecessary. Moreover, the doping can be more easily and more uniformly attained with good reproducibility compared with a case using a vaporized solution of $B_2O_2$ dissolved in methanol, ethanol, acetone or the like, which is used from the safety conscious viewpoint, as a source of boron to be doped.

As explained above, if $B(OCH_3)_3$ is used, and the doping amount of boron is controlled so that the electric resistivity of the diamond film should become $10^7$ Ω·cm or less, the charge up phenomenon can be surely avoided in a defect test of a mask required when the diamond film is used for a mask for lithography, especially a mask for X-ray or electron beam lithography. Therefore, it becomes possible to produce a diamond mask of high quality for lithography. Moreover, since the charge up phenomenon can be avoided also when the mask is actually used as a mask for the electron beam lithography, it enables highly precise and highly efficient image transfer.

PREFERRED EMBODIMENTS OF THE INVENTION

Figure 1:
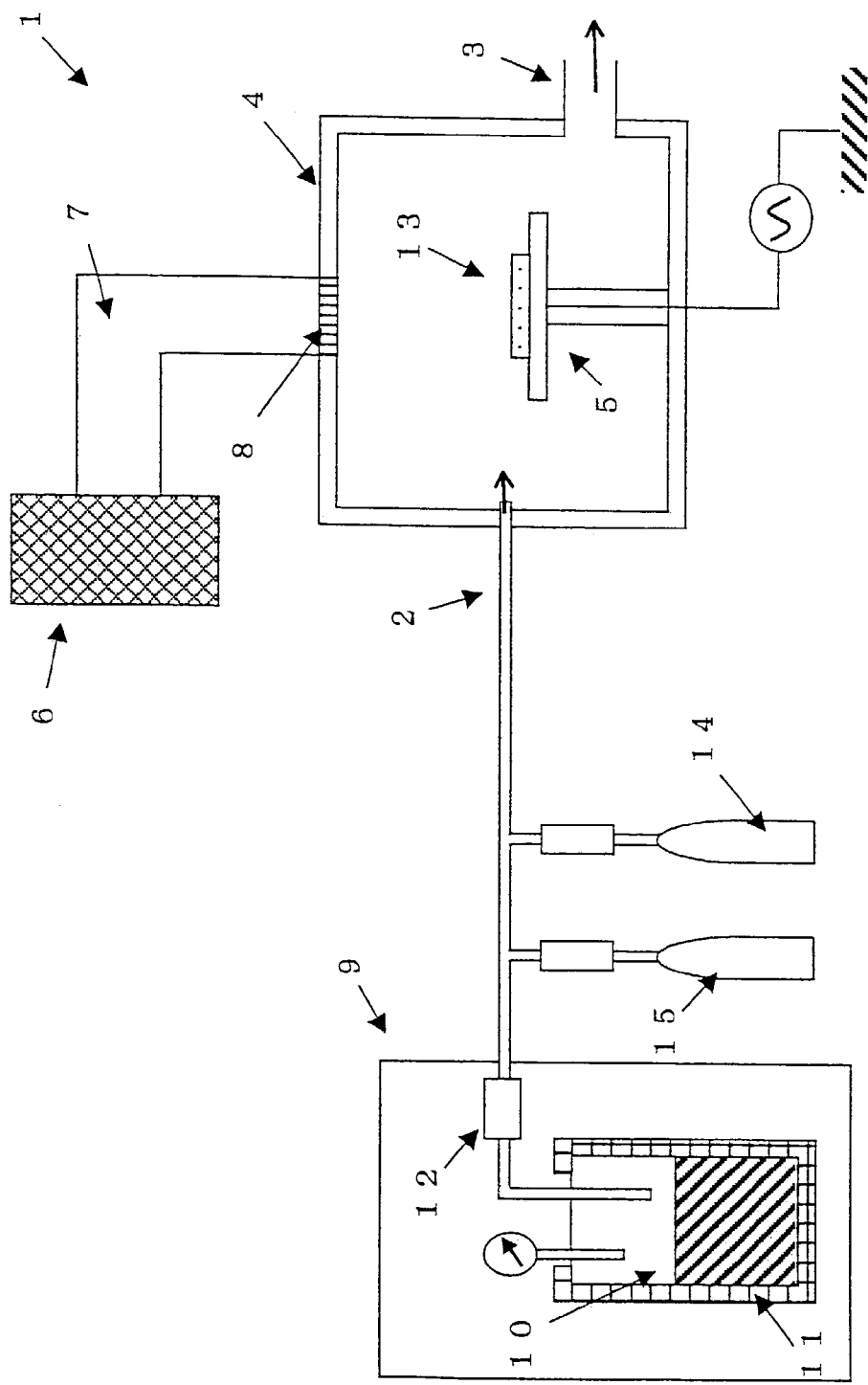
FIG. 1 is a schematic view showing a microwave CVD apparatus, which is an example of the apparatus according to the present invention.

Hereafter, embodiments of the present invention will be explained. However, the present invention is not limited to these.

The inventors of the present invention conceived that, in order to easily and uniformly produce a diamond film having a low electric resistivity with few problems concerning handling such as serious bad influence on human bodies and explosiveness and with good reproducibility, $B(OCH_3)_3$ could be used as a source of boron to be doped during formation of a vapor phase synthesized diamond film, and thus accomplished the present invention.

FIG. 1 is a schematic view showing a microwave CVD apparatus, which is a typical apparatus for producing a diamond film, provided with an apparatus for vaporizing and supplying $B(OCH_3)_3$ as an exemplary microwave CVD apparatus for the present invention.

In this microwave CVD apparatus 1, a base material stage 5 provided with heating means such as a heater is disposed in a chamber 4 provided with a gas inlet pipe 2 and a gas outlet pipe 3. Further, a microwave power source 6 is connected to a microwave introduction window 8 through a waveguide 7 so that plasma can be generated in the chamber 4. Furthermore, an apparatus for supplying a mixed raw material gas is connected at the other end of the gas inlet pipe 2, and a hydrogen gas supplying tank 14, a carbon-containing gas supplying tank 15 and, in particular, an apparatus 9 for supplying $B(OCH_3)_3$ used for the present invention are provided on that side. In this supplying apparatus 9, there are provided a liquid $B(OCH_3)_3$ tank 10, a heater 11 for vaporizing $B(OCH_3)_3$, which is liquid at room temperature, and a mass flow controller 12 for precisely controlling the flow rate of $B(OCH_3)_3$.

Hereafter, the method for producing a diamond film by using $B(OCH_3)_3$ as a source of boron to be doped in the production of a diamond film on a base material by a vapor phase reaction with introducing a raw material gas will be explained with reference to FIG. 1.

First, when a diamond film is formed on a base material, generation density of diamond nuclei can be increased by providing diamond particles on a base material surface, and thereby formation of a vapor phase synthesized diamond film becomes easy. Therefore, to obtain a uniform continuous film even when it is a thin film, it is effective to perform a pretreatment for seeding diamond particles on the base material surface by coating of the base material surface with diamond suspension, ultrasonication with diamond suspension, scratch treatment with diamond particles or the like.

A diamond film can be produced on a base material subjected to such a pretreatment by the vapor phase synthesis method utilizing, for example, DC arc discharge, DC glow discharge, combustion flame, radiofrequency wave (R.F.), microwave, hot filament or the like as an energy source. Among these production methods, the microwave CVD method and the hot filament CVD method are preferred, since they enable formation of films having a large size and good crystallinity.

In the apparatus shown in FIG. 1, the microwave CVD method is used as an example of these vapor phase synthesis methods. A base material 13 subjected to a pretreatment as described above is placed on the base material stage 5, and then inside of the chamber 4 is evacuated by a non-illustrated rotary pump to a pressure of $10^{-3}$ Torr or less.

Then, a main constitutive raw material gas, for example, a carbon-containing gas such as methane, ethylene, acetylene and carbon monoxide is supplied from the carbon-containing gas supplying tank 15 at a desired flow rate, and a mixed raw material gas consisting of the raw material gas diluted with hydrogen gas supplied from the hydrogen gas supplying tank 14 and added with $B(OCH_3)_3$ gas according to the present invention at a predetermined concentration is introduced from the inlet pipe 2 into the chamber 4.

At this time, the volume concentration of the $B(OCH_3)_3$ gas with respect to the total mixed raw material gas is preferably controlled to be more than 0 vol. % but 8 vol. % or less. If the vapor phase reaction is performed by using a mixed raw material gas added with $B(OCH_3)_3$ gas at a concentration more than 0 vol. %, the diamond film to be obtained can be doped with boron, and thus the electric resistivity thereof can be reduced. Moreover, by controlling the concentration of the $B(OCH_3)_3$ gas to be 8 vol. % or less, a desired electric resistivity value can be obtained while maintaining high crystallinity. If the $B(OCH_3)_3$ gas concentration exceeds 8 vol. %, the boron concentration exceeds that of the saturated state, and doping of boron at a concentration exceeding that level is difficult. Even though it is possible, the crystallinity is markedly degraded or generation of defects is increased, and thus it is not practically useful.

Then, after the opening degree of a valve of the gas outlet pipe 3 is adjusted to obtain a pressure of 20 Torr in the chamber 4, microwaves are applied from the microwave power source 6 via the waveguide 7 to generate plasma in the chamber 4 and thereby form a diamond film on the base material 13.

At this time, in order to control the film stress in the diamond film, the base material 13 may be heated by, for example, a heater such as a sintered SiC heater included in the base material stage 5.

Boron may be doped only into a partial layer of the formed diamond. For example, $B(OCH_3)_3$ may be added to dope boron only when a layer having a thickness of 0.5 μm or less is formed on a surface of the side irradiated with an electron beam (the side of base material interface) during use of the diamond film as an electron beam mask, and the other part of the film may be formed without the doping. By doing so, the amount of $B(OCH_3)_3$ used can be reduced, thereby the degradation of crystallinity is minimized and the cost can also be reduced.

It is the most characteristic feature of the present invention that boron doping of diamond is attained by using a mixed raw material gas containing $B(OCH_3)_3$ in the vapor phase synthesis.

By replacing the source of boron to be doped from conventionally and generally used $B_2H_6$ or $PH_3$ to $B(OCH_3)_3$ as described above, problems concerning danger of handling such as serious bad influence on human bodies and explosiveness are ameliorated, and thus special apparatuses for safety become unnecessary. Moreover, it becomes possible to more easily and more uniformly dope boron into a diamond film with better reproducibility compared with a case where a solution dissolving $B_2O_3$, which has been used from the safety conscious viewpoint, in methanol, ethanol, acetone or the like is vaporized and used as the source of boron to be doped.

By controlling the $B(OCH_3)_3$ gas concentration added to the raw material gas, the electric resistivity value of the diamond film to be produced can be controlled. In particular, if it is controlled so that the electric resistivity of the diamond film should become $10^7$ Ω·cm or less, the charge up phenomenon can surely be avoided in a defect test of a mask which is required when the diamond film is used as a mask for lithography, especially a mask for X-ray or electron beam lithography. Thus, it becomes possible to produce diamond for lithography of high quality. Moreover, when the film is actually used as a diamond mask for electron beam lithography, the charge up phenomenon can also be avoided, and thus it becomes possible to perform highly precise and highly efficient image transfer.

EXAMPLES

Hereafter, the present invention will be specifically explained with reference to an example and a comparative example.

Example 1

A single crystal silicon wafer having a diameter of 100 mm, thickness of 2 mm and crystal orientation of <100>, of which both surfaces were polished, was prepared as a base material and subjected to a pretreatment in order to improve the generation density of diamond nuclei. First, the base material was adsorbed on a spin coater by vacuum suction, and 50 ml of suspension of diamond particles (cluster diamonds having a mean particle size of 50 nm) was dropped onto the surface. The wafer was rotated at 3000 rpm for 30 seconds to obtain uniformly coated state of the suspension of diamond particles on the surface. Then, the coated suspension was air-dried to form a seeded layer of diamond on the base material surface. After the pretreatment was performed as described above, the base material was set on the base material stage in the chamber of the microwave CVD apparatus shown in FIG. 1.

Then, after reduced pressure of $10^{-3}$ Torr or less was obtained by evacuation using a rotary pump, a mixed raw material gas consisting of methane, hydrogen gas and $B(OCH_3)_3$ gas was supplied from the gas inlet pipe. The gases were introduced into the chamber at 40.0 sccm for methane gas, 940.0 sccm for hydrogen gas and 20.0 sccm for $B(OCH_3)_3$ gas to obtain a volume ratio of methane gas/hydrogen gas/$B(OCH_3)_3$=4.0/94.0/2.0. Then, opening degree of the valve of the gas outlet pipe was controlled to obtain a pressure of 20 Torr in the chamber, and plasma was generated by applying microwaves of 3000 W to form a boron-doped diamond film on the base material for 2 hours.

During the film formation, the base material generated heat due to absorption of the microwaves, and the surface temperature reached 860° C.

A boron-doped diamond film obtained as described above was finished by polishing. In a 35 mm square region at the center of the base material, the thickness was 0.50 μm±0.04 μm, stress was 60 MPa±12 MPa, and surface roughness was 3 nm in terms of Ra, and thus they were at highly practically useful levels. In addition, little fluctuation was observed among batches, which was practically very advantageous.

Furthermore, the above diamond film formed substrate was processed into a mask substrate for electron beam lithography, and a stencil type mask for electron beam lithography was produced by using the mask substrate. Then, the value of electric resistivity of the diamond film was measured, and it was found to be 0.6 Ω·cm. Thus, even when a defect test of the mask was performed, the charge up phenomenon was not caused. Moreover, also when it was actually used as a mask for electron beam lithography, there was no charge up phenomenon, and stable and highly precise image transfer was possible.

Comparative Example 1

A diamond film was formed in the same manner as in the example 1 except that the $B(OCH_3)_3$ gas was not used as a source of boron to be doped, and instead a solution dissolving $B_2O_3$ in ethanol was vaporized to add to the raw material gas. That is, on the surface of the silicon wafer subjected to the pretreatment where the diamond suspension was spin-coated, a boron-doped diamond film was formed on the base material for 3.5 hours by introducing a mixed raw material gas having a composition for obtaining a diamond film showing crystallinity (confirmed by the Raman spectrometry) and electric resistivity (confirmed by the four-terminal method) of the same levels as those obtained in the example 1 (methane gas/hydrogen gas/$B_2O_3$ gas=1.0/97.0/2.0) into the chamber and applying microwaves of 3000 W at 20 Torr to generate plasma, and then the wafer was polished. Although the obtained diamond showed reduced resistivity of 30 Ω·cm, thickness and stress showed bad uniformity, i.e., the thickness was 0.50 μm±0.11 μm and the stress was 150 MPa±60 MPa in a 35 mm square region at the center of the base material.

Moreover, fluctuation of the concentration of the $B_2O_3$ solution in ethanol was observed as the $B_2O_3$ solution was consumed, and temperature control was strictly required during the process. Thus, it was extremely difficult to obtain a uniformly doped diamond in terms of uniformity in a film and among batches. Furthermore, a large amount of generated $B_2O_3$ particles adhered, and thus it was disadvantageous also in view of prevention of defect generation.

($B_2H_6$ Doping)

First of all, when a diamond film having characteristics of the same levels is formed by using $B_2H_6$ as a source of boron to be doped without using $B(OCH_3)_3$ gas, a safety measure for apparatuses to be prepared must be completely different from those of the example 1. That is, the permissible concentration of $B_2H_6$ for human bodies is 0.1 ppm, and it shows extremely high explosiveness, i.e., the explosion limit thereof is 0.9 to 98.0 vol. %. Therefore, enormous cost is required for installations for preventing leakage of $B_2H_6$. Moreover, in order to obtain a conductivity of the same level as that of the example 1, $B_2H_6$ must be added at a concentration of several vol. %, and it is an extremely dangerous concentration.

After all, since use of $B_2H_6$ was too unpractical taking economy, safety and characteristics of diamond to be obtained into consideration, a comparison test was given up.

The present invention is not limited to the embodiments described above. The above-described embodiments are mere examples, and those having the substantially same configuration as that described in the appended claims and providing the similar functions and advantages are included in the scope of the present invention.

For example, while the use of the diamond film of the present invention was explained for cases where it is used as a masking member for X-ray or electron beam lithography, the present invention is not limited to this use.

What is claimed is:

1. A method for producing a diamond film on a base material by a vapor phase reaction at least with introducing a raw material gas, wherein $B(OCH_3)_3$ gas is added to the raw material gas as a source of boron to be doped, and a diamond film is deposited on the base material by a vapor phase reaction utilizing the mixed raw material gas, and wherein, when the diamond film is produced on the base material, only a part of the film is formed with adding $B(OCH_3)_3$ gas to the raw material gas, and the other part of the film is formed without adding $B(OCH_3)_3$ gas to the raw material gas, thereby reducing the degradation in crystallinity and reducing the amount of trimethyl borate used.

2. The method for producing a diamond film according to claim 1, wherein the $B(OCH_3)_3$ gas is added to the raw material gas to be introduced at a volume concentration of more than 0 vol. % but 8 vol. % or less with respect to the total mixed raw material gas.

3. The method for producing a diamond film according to claim 2, wherein the doping of boron is controlled so that electric resistivity of the diamond film should become $10^7$ Ω·cm or less at 20° C.

4. The method for producing a diamond film according to claim 3, wherein the part of the film formed with adding $B(OCH_3)_3$ gas to the raw material gas has a thickness of 0.5 μm or less.

5. A diamond film produced by the method according to claim 3.

6. The method for producing a diamond film according to claim 2, wherein the part of the film formed with adding $B(OCH_3)_3$ gas to the raw material gas has a thickness of 0.5 μm or less.

7. A diamond film produced by the method according to claim 2.

8. A mask substrate utilizing the diamond film according to claim 7.

9. The method for producing a diamond film according to claim 1, wherein the doping of boron is controlled so that electric resistivity of the diamond film should become $10^7$ Ω·cm or less at 20° C.

10. The method for producing a diamond film according to claim 9, wherein the part of the film formed with adding $B(OCH_3)_3$ gas to the raw material gas has a thickness of 0.5 μm or less.

11. A diamond film produced by the method according to claim 9.

12. A mask substrate utilizing the diamond film according to claim 11.

13. The method for producing a diamond film according to claim 1, wherein the part of the film formed with adding $B(OCH_3)_3$ gas to the raw material gas has a thickness of 0.5 μm or less.

14. A diamond film produced by the method according to claim 1.

15. A mask substrate utilizing the diamond film according to claim 14.

* * * * *